(12) United States Patent
Oh et al.

(10) Patent No.: US 7,125,756 B2
(45) Date of Patent: Oct. 24, 2006

(54) METHOD FOR FABRICATING LIQUID CRYSTAL DISPLAY DEVICE

(75) Inventors: Jae Young Oh, Gyeonggi-Do (KR); Kyoung Mook Lee, Seoul (KR); Sung Jin Hong, Gwanak-Gu (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/017,853

(22) Filed: Dec. 22, 2004

(65) Prior Publication Data
US 2005/0142704 A1 Jun. 30, 2005

(30) Foreign Application Priority Data
Dec. 29, 2003 (KR) .................. 10-2003-0099327

(51) Int. Cl.
*H01L 21/00* (2006.01)
*H01L 21/338* (2006.01)

(52) U.S. Cl. ............... 438/149; 438/151; 438/164; 438/171

(58) Field of Classification Search ........... 438/149, 438/151, 164, 171; 257/72, 59
See application file for complete search history.

(56) References Cited

U.S. PATENT DOCUMENTS 6,515,300 B1* 2/2003 den Boer et al. ............. 257/59
2004/0036816 A1* 2/2004 Yun ......................... 349/43
2005/0142714 A1* 6/2005 Chae et al. ................. 438/197

* cited by examiner

Primary Examiner—Hsien-Ming Lee
(74) Attorney, Agent, or Firm—McKenna Long & Aldridge LLP (57) ABSTRACT

Disclosed is a method for fabricating a thin film transistor for a liquid crystal display device using four masks and without using a diffraction mask. The method of the present invention uses a first mask when forming a gate electrode, a second mask when forming an active pattern, a third mask when forming a plurality of contact holes at an upper portion of a channel layer, and a fourth mask when forming a pixel electrode and source and drain electrodes, so that the resulting liquid crystal display device may be completed by four masks without using a diffraction exposure method. Instead of using a diffraction mask, the present invention uses different etching rates between an insulating layer and an electrode layer, which is used for source and drain electrodes, in fabricating a thin film transistor.

20 Claims, 6 Drawing Sheets

CHANNEL REGION | STORAGE REGION | GATE PAD PORTION | DATA PAD PORTION

FIG. 1E
RELATED ART

CHANNEL REGION | STORAGE REGION | GATE PAD PORTION | DATA PAD PORTION

METHOD FOR FABRICATING LIQUID CRYSTAL DISPLAY DEVICE

This application claims the benefit of Korean Patent Application No. 2003-99327, filed on Dec. 29, 2003, which is hereby incorporated by reference for all purposes as if fully set forth herein.

BACKGROUND OF THE INVENTION

1. Field of the Invention

The present invention relates to a method for fabricating a liquid crystal display device, and more particularly, to a method for fabricating a thin film transistor as a switching device of LCD by only four masks without using a diffraction mask.

2. Discussion of the Related Art

A liquid crystal display device includes a thin film transistor (TFT) array substrate on which a plurality of thin film transistors are arranged in a matrix form, a color filter substrate facing the TFT array substrate for displaying an image in color, and a liquid crystal layer filled into the space between the substrates.

Processes for forming the thin film transistor substantially affect the performance of the liquid crystal display device. A process for fabricating a thin film transistor (TFT) of a liquid crystal display device will be described with reference to FIGS. 1A to 1E.

A process of fabricating a TFT is typically performed by either a five-mask process or a four-mask process. FIGS. 1A to 1E are views illustrating a process of fabricating a thin film transistor using five masks.

Figure 1A:
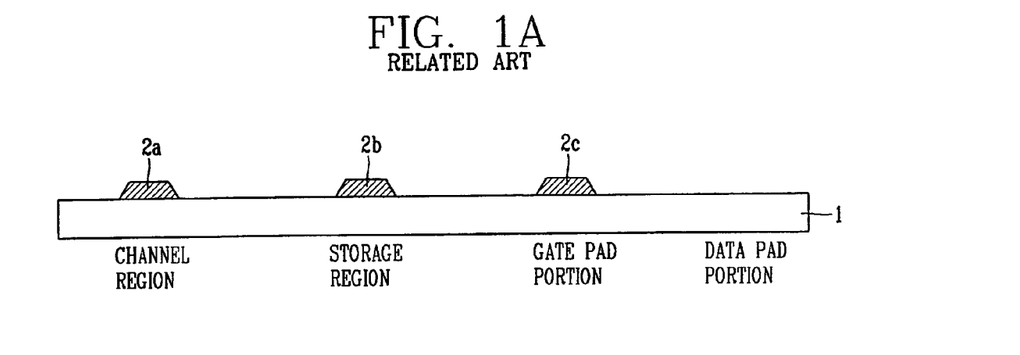
FIGS. 1A to 1E are views illustrating processes for a method for fabricating a liquid crystal display device by five masks in accordance with the related art.

As illustrated in FIG. 1A, a metal is deposited on a transparent substrate 1 such as a glass. In general, the metal is formed by a sputtering method. After forming the metal, photoresist (not shown) is deposited on the metal layer. By means of photolithography using a first mask (now shown), a gate electrode 2a in a channel region, a first storage electrode 2b in a storage region and a gate pad pattern 2c are formed.

Figure 1B:
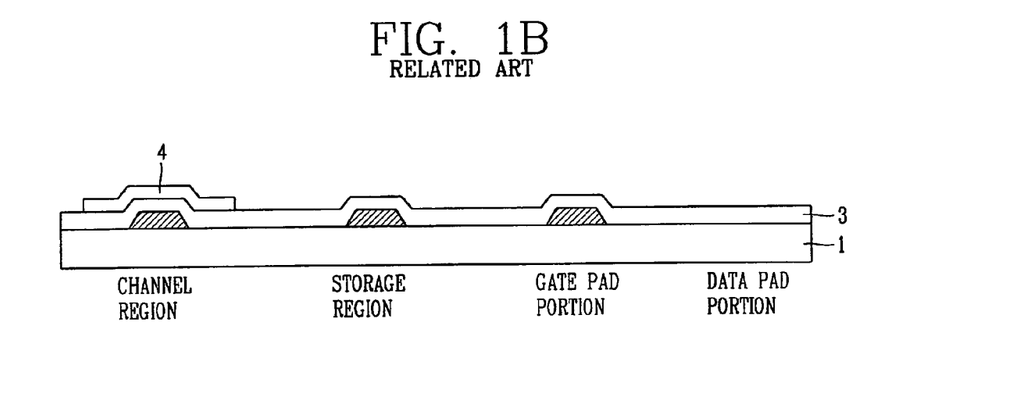

Subsequently, as illustrated in FIG. 1B, a gate insulating layer 3 of silicon oxide or silicon nitride is formed on the substrate on which the gate electrode 2a, the first storage electrode 2b and gate pad pattern 2c are formed, and a semiconductor layer is formed on the gate insulating layer 3. Then, by means of photolithography using a second mask (not shown), an active layer 4 is defined on the channel region. The active layer 4 may include an amorphous silicon layer forming channel and a high impurity doped semiconductor layer for ohmic contact characteristics. The gate insulating layer 3 and the active layer 4 may generally be formed by a plasma enhanced chemical vapor deposition (PECVD) method.

Figure 1C:
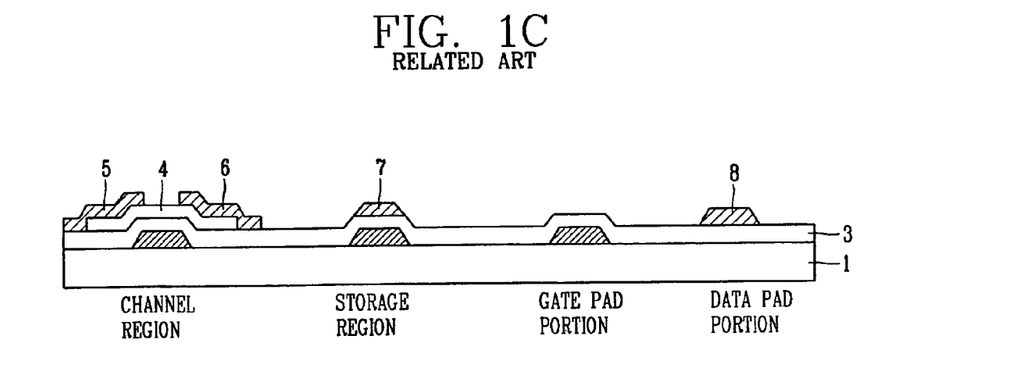

After forming the active layer, as illustrated in FIG. 1C, a conductive layer is formed on the active layer and the gate insulating layer 3. The conductive layer is patterned to form a source and drain electrodes 5 and 6 at the channel region, a second storage electrode 7 at the storage region, and a data pad pattern 8 at a data pad portion by a photolithography process using a third mask (not shown).

Figure 1D:
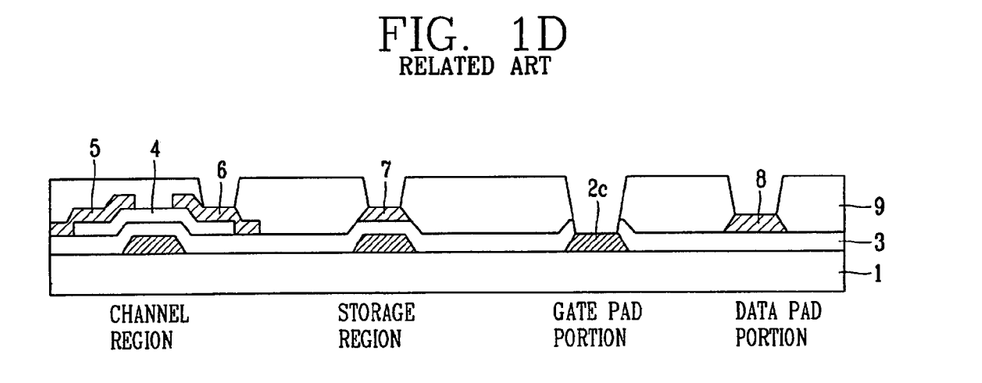

Next, as illustrated in FIG. 1D, a passivation layer 9 on the source and drain electrodes 5 and 6 is formed by photolithography using a fourth mask (not shown). Contact holes are formed on the passivation layer to expose the drain electrode 6 at the channel region, the second storage electrode 7, the gate pad pattern 2c and the data pad pattern 8.

Figure 1E:
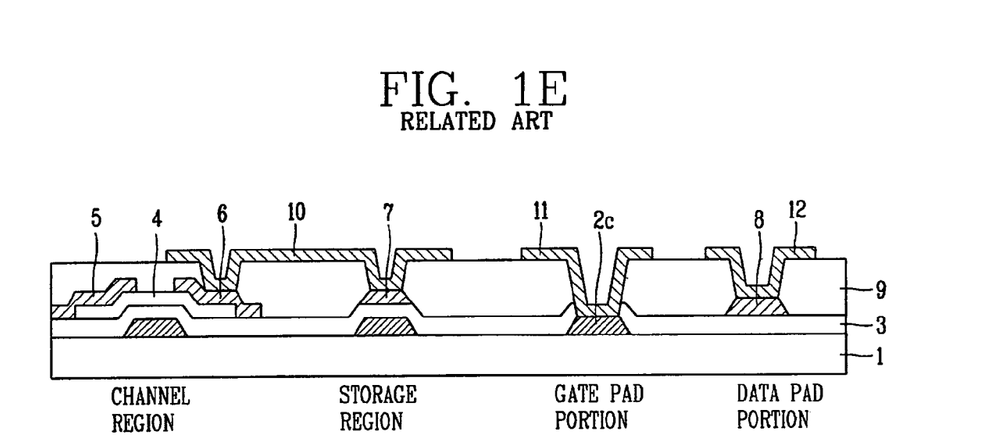

After forming the contact holes on the passivation layer, as illustrated in FIG. 1E, a transparent electrode material is sputtered. A pixel electrode 10 connected to the drain electrode 6 at the channel region and to the second storage electrode 7 at the storage region is formed by photolithography using a fifth mask (not shown) in conjunction with the transparent electrode materials. The transparent electrode materials are selectively etched to form a gate pad 11 connected to the gate pad pattern 2c at the gate pad portion and a data pad 12 connected to the data pad pattern 8.

The method for fabricating a liquid crystal display device according to the related art has a problem that there are limits to reduction of fabrication costs and simplification of processes due to multiple photolithography procedures corresponding to five masks.

A related art solution to this problem involves a method for fabricating a liquid crystal display device using four masks, which is described below in reference to FIGS. 2A to 2G.

Figure 2A:
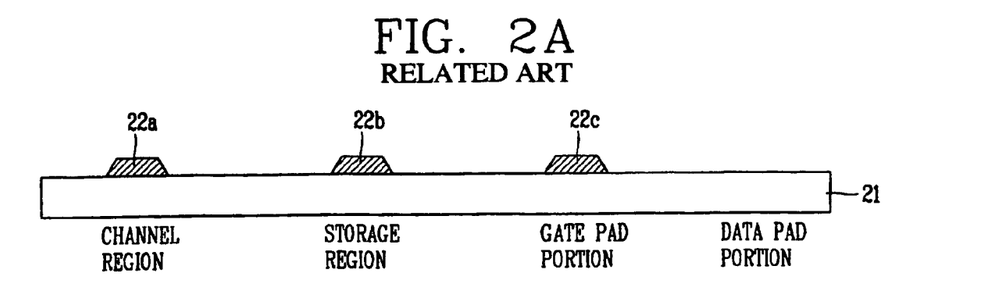
FIGS. 2A to 2H are views illustrating processes for a method for fabricating a liquid crystal display device by four masks in accordance with the related art.
Figure 2B:
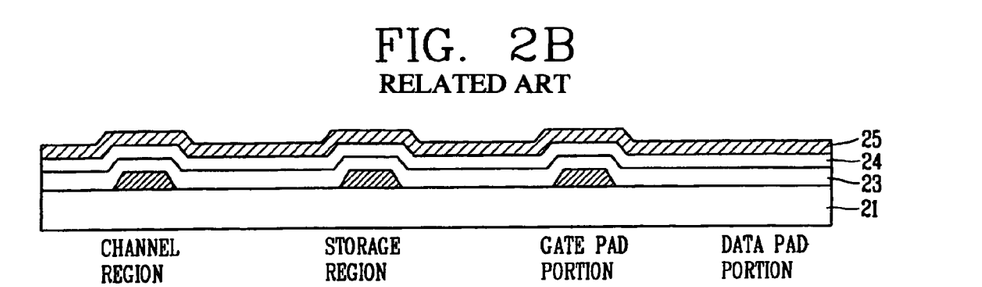

As illustrated in FIG. 2A, after depositing electrode materials on a substrate 21, a gate electrode 22a, a storage electrode 22b and a gate pad pattern 22c are selectively formed on a channel region, a storage region and a gate pad portion on the substrate 21, respectively. In addition, as illustrated in FIG. 2B, a gate insulating layer 23 of silicon oxide or silicon nitride is formed on the substrate; a semiconductor layer 24 is formed on the gate insulating layer 23; and a conductive layer 25 is formed on the semiconductor layer 24, sequentially. The semiconductor layer 24 may be a dual layer of amorphous silicon (a-Si) and a semiconductor layer doped with high density impurities.

Figure 2C:
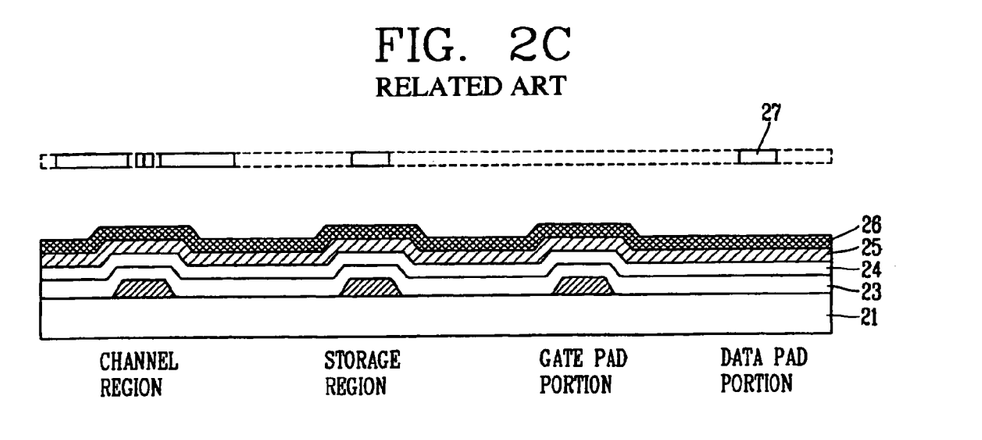
Figure 2D:
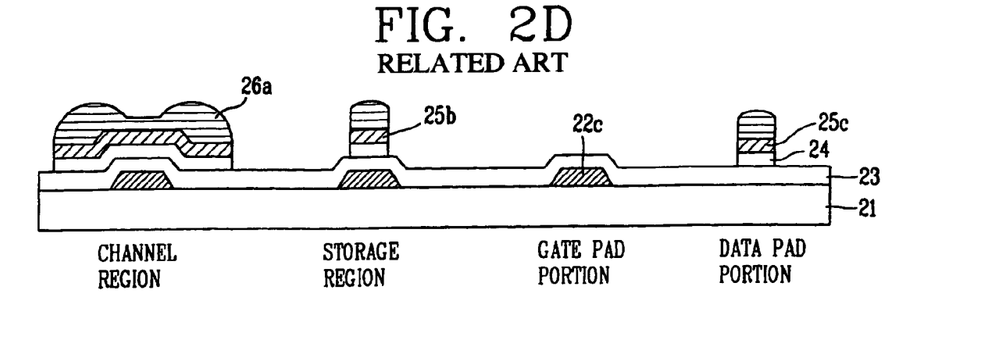

Next, as illustrated in FIG. 2C, a photoresist 26 is deposited on the conductive layer 25 and subsequently patterned using a second mask 27. The resulting photoresist pattern 26a remains at the channel region, the storage region, and the data pad portion. In particular, diffraction exposure is radiated onto the photoresist 26a formed at the gate electrode 22a to form a stepped photoresist pattern having a thin center portion. As a result of the diffraction exposure, the photoresist on the channel region has a stepped shape such that the photoresist on the channel region is thinner than that on source and drain regions, thereby two-step processes exposing the channel region and forming source and drain electrodes may be performed. As also illustrated in FIG. 2D, the conductive layer 25 and the gate insulating layer 24 are partially removed by the photoresist pattern 26a formed by the diffraction exposure to define the channel region, a second storage electrode 25b and a data pad pattern 25c.

Figure 2E:
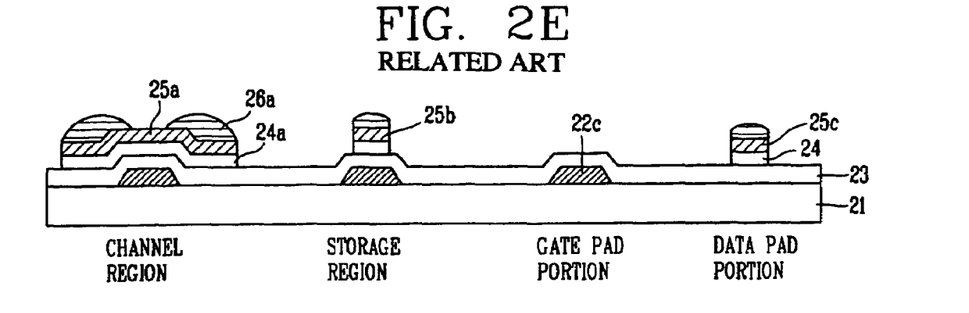
Figure 2F:
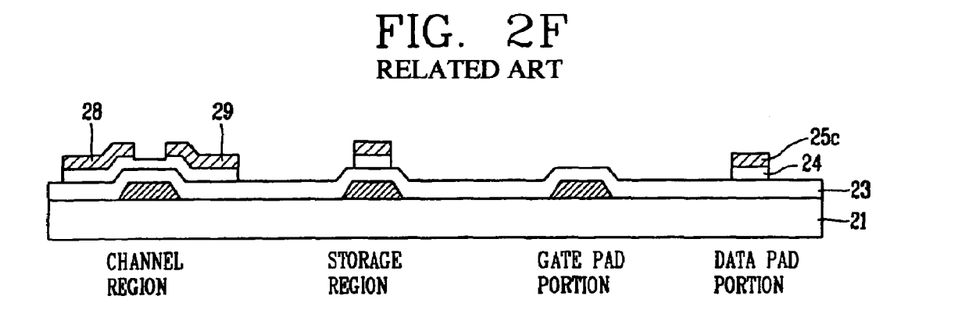

Next, as illustrated in FIG. 2E, the photoresist 26a on the channel region is ashed and selectively removed. As a result, a conductive layer 25a on the channel is exposed. As illustrated in FIG. 2F, drain electrodes 28 and 29 are formed by etching the conductive layer 25a using the photoresist pattern 26a as an etching mask, and the photoresist pattern 26a is stripped.

Figure 2G:
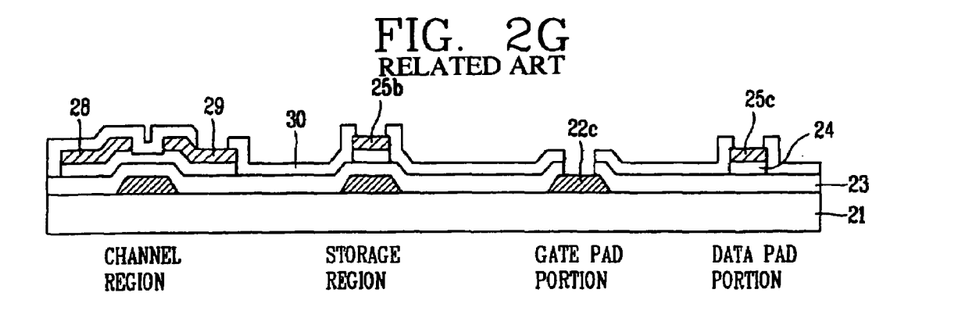

Referring to FIG. 2G, a passivation layer 30 is formed on an entire surface of the substrate. Then, through use of photolithography and a third mask (not shown), contact holes are formed in the passivation layer 30 to expose the drain electrode 29, the second storage electrode 25b, the gate pad pattern 22c, and the data pad pattern 25c.

Figure 2H:
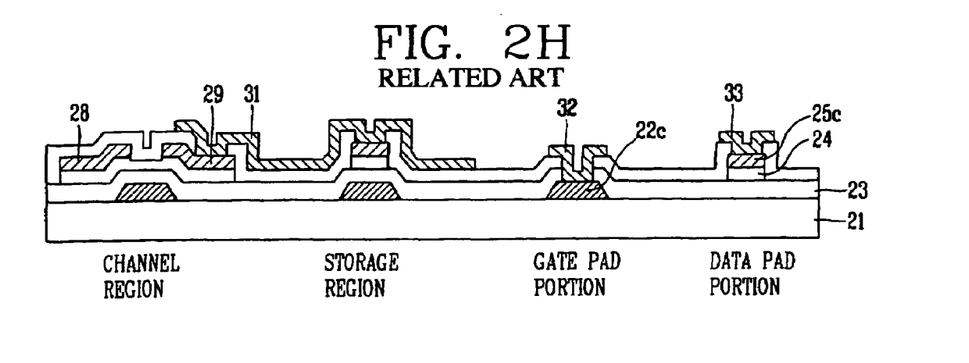

Next, as illustrated in FIG. 2H, transparent electrode materials are formed on an upper portion of the result, and a pixel electrode 31 is formed by performing photolithography using a fourth mask (not shown). The transparent electrode materials are selectively etched to form a gate pad 32 connected to the pattern for gate pad 22c and a data pad 32 connected to the data pad pattern 25c at the same time.

As so far described, a method for fabricating a liquid crystal display device using four masks may reduce fabrication costs and simplify processes in comparison to a method for fabricating a liquid crystal display device using five masks. However, since a diffraction mask used for the four-mask process is an expensive element, the diffraction mask causes fabrication costs of a thin film transistor to increase.

SUMMARY OF THE INVENTION

Accordingly, the present invention is directed to a method for fabricating a liquid crystal display device that substantially obviates one or more of the problems due to limitations and disadvantages of the related art.

An advantage of the present invention is to reduce fabrication costs by forming a thin film transistor without using a diffraction mask.

To achieve these and other advantages and in accordance with the purpose of the present invention, as embodied and described herein, a method for fabricating a thin film transistor for a liquid crystal display device comprises forming a gate electrode; forming a first insulating layer on the gate electrode; forming a semiconductor layer on the first insulating layer having a first etching rate; forming a conductive layer on the semiconductor layer, the conductive layer having a second etching rate; forming a second insulating layer having a third etching rate; forming plurality of openings on the second insulating layer using a first photoresist pattern; forming a pixel electrode on the second insulating layer using a second photoresist pattern; and forming a source electrode and a drain electrode by removing the conductive layer and second semiconductor layer on a channel region, wherein the removing includes using at least one etchant selected based in part on the first, second, and third etching rates.

To achieve these and other advantages and in accordance with the purpose of the present invention, as embodied and described herein, a method for fabricating a liquid crystal display device comprises forming a gate electrode, a storage electrode and a gate pad pattern on a substrate; forming a first insulating layer covering the gate electrode, the storage electrode and the gate pad pattern on the substrate; forming a semiconductor layer on the first insulating layer; forming a conductive layer on the semiconductor layer; forming an active region and a data pad pattern by patterning the conductive layer and the semiconductor layer; forming a second insulating layer covering the active region and the data pad pattern; forming a plurality of openings on the second insulating layer using a first photoresist pattern as a mask, wherein the openings include a first opening exposing the conductive layer on the channel region, a second opening exposing the conductive layer on a drain region, a third opening exposing the gate pad pattern region and the forth opening exposing the conductive layer on the date pad pattern region; forming a transparent electrode material on the second insulating layer having the plurality of openings; forming a pixel electrode, gate pad and data pad by patterning the transparent electrode materials using a second photoresist pattern as a mask; removing the second photoresist pattern on the second insulating layer; and removing the conductive layer and the second insulating layer at the channel region using the pixel electrode as a mask, thereby forming a source and drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to exemplary embodiments of the present invention, examples of which are illustrated in the accompanying drawings.

Figure 3A:
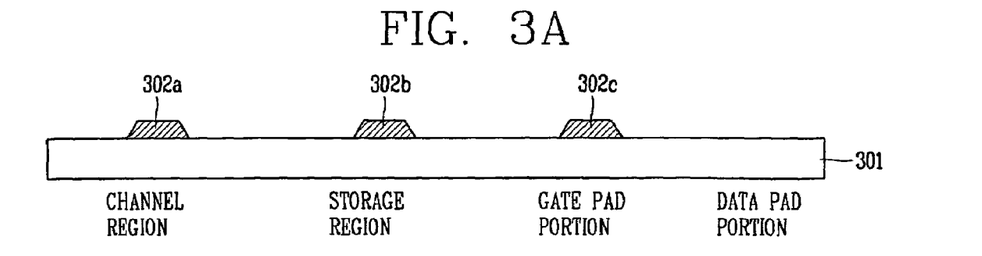
FIGS. 3A to 3H are views illustrating processes for a method for fabricating a liquid crystal display device in accordance with the present invention.

As illustrated in FIG. 3A, a metal layer is formed on a transparent substrate 301 to form a gate electrode 302a at a channel region, a first storage electrode 302b at a storage region, and a gate pad pattern 302c at a gate pad portion. The metal layer may be composed of an aluminum alloy or a dual layer of aluminum and molybdenum, although other suitable electrode materials may be used. The metal layer may be formed on the substrate by a sputtering method. After forming the metal layer, a photoresist (not shown) is coated on the metal layer and the photoresist film is patterned by photolithography using a first mask (not shown). A wet etching process may be used to pattern the metal layer, although other etching processes are possible and within the scope of the invention. As a result of patterning the metal layer, a gate electrode 302a, a first storage electrode 302b and a gate pad pattern 302c are formed.

Figure 3B:
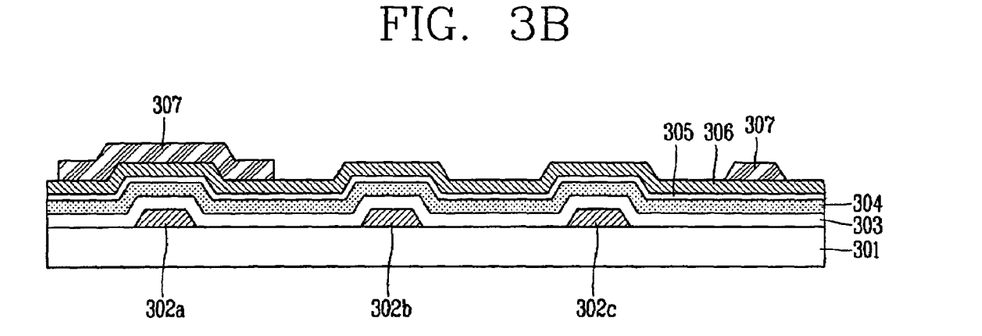

Next, as illustrated in FIG. 3B, a first insulating layer 303, semiconductor layers 304 and 305 and a conductive layer 306 are respectively formed on the substrate 301.

The first insulating layer 303 may be composed of silicon oxide or silicon nitride. In a particular embodiment, the first insulating layer may include silicon nitride (SiNx) having superior dry etching characteristics, and a first insulating layer having a thickness of about 4000 Å. The first insulating layer 303 may be formed by a plasma enhanced chemical vapor deposition (PECVD) method, although other deposition techniques are possible and within the scope of the invention.

After forming the first insulating layer 303, the semiconductor layers 304 and 305 are formed on the first insulating layer 303. The first semiconductor layer 304 may be an amorphous silicon layer 304, and the second semiconductor layer 305 may be doped with high density impurities. The amorphous silicon layer 304 is used as a channel for the thin film transistor, and the second semiconductor layer 305 substantially provides ohmic contacts between the first semiconductor layer and the source and drain electrodes.

The semiconductor layers 304 and 305 may be formed by the PECVD method. When an amorphous silicon semiconductor is deposited in a plasma state, N+ type ions such as phosphorus (P) may be additionally included and deposited along with the amorphous silicon semiconductor to form the second semiconductor layer 305.

After forming the semiconductor layers 304 and 305, a conductive layer 306 is formed on the semiconductor layers. In a particular example, molybdenum having an etching rate different from the insulating layer is used as the conductive layer 306. The conductive layer 306 may be a predetermined metal layer having different etching characteristics than the gate insulating layer 303. For example, the conductive layer 306 and the second semiconductor layer 305 may have etching rates such that they etch at a higher rate than the insulating layer 303.

The conductive layer 306 having molybdenum may be etched by a dry etching method or a wet etching method. The conductive layer 306 having molybdenum has a certain etching rate relative to the gate insulating layer 303, which may include silicon nitride and may be dry-etched. That is, since a molybdenum layer is strong against the dry etching in comparison to the gate insulating layer, only small part of the molybdenum layer is etched while silicon nitride is being etched by the dry etching.

After forming the conductive layer 306, a photoresist pattern 307 is formed on the channel region and on the data pad portion and is patterned by photolithography, as illustrated in FIG. 3B. The conductive layer 306 and the first and second semiconductor layers 304 and 305 are selectively removed by using the photoresist pattern 307 as a mask to thereby define an active region and a data pad pattern.

The conductive layer 306 may be effectively etched by wet etching, and the semiconductor layers 304 and 305 may be effectively etched by dry etching. As a result of the etching, active layers 304a and 305a and a conductive layer pattern 306a on the active layers are formed, as illustrated in FIG. 3C.

Figure 3C:
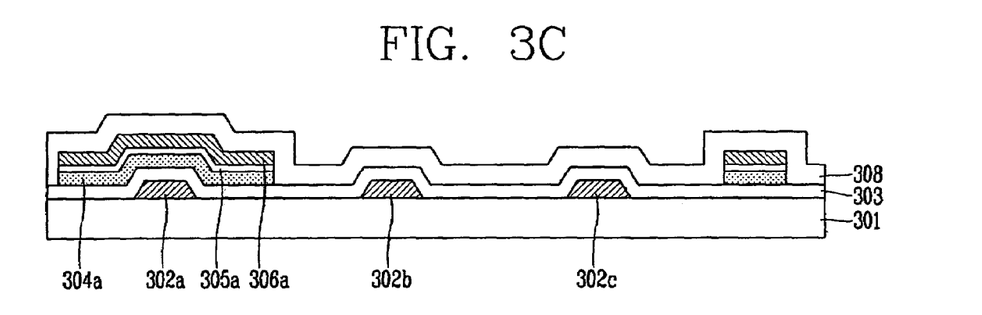
Figure 3D:
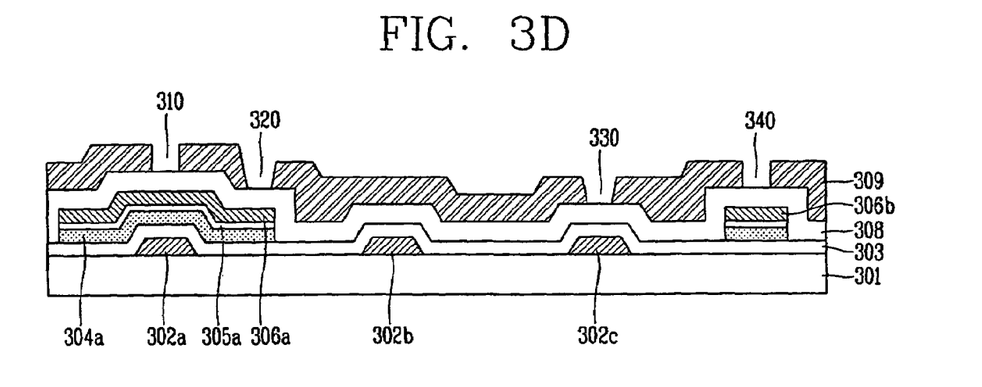
Figure 3E:
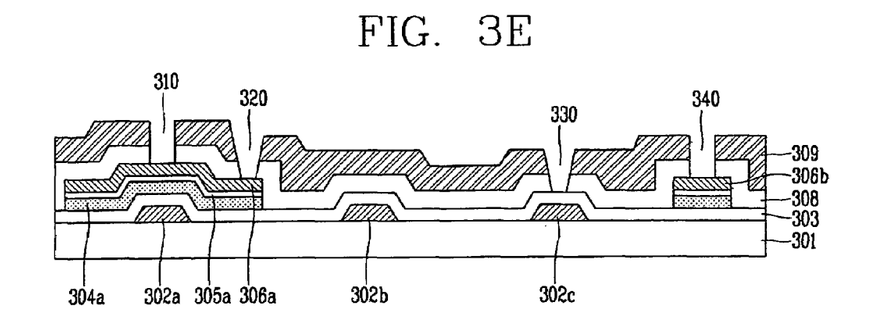

Next, as further illustrated in FIG. 3C, a passivation layer 308 composed of silicon nitride or silicon oxide is formed on the active layers 304a and 305a and electrode layer pattern 306a. In a particular embodiment, silicon nitride is used a passivation layer, which has superior dry etching characteristics than conductive layer 306. After forming the passivation layer 308, as illustrated in FIG. 3D, a photoresist is coated on the passivation layer 308 and exposure and development is performed, thereby forming a photoresist pattern. The photoresist pattern defines a plurality of contact holes. The plurality of contact holes is formed on the passivation, or second insulating layer 308. As illustrated in FIG. 3E, the contact holes include a first contact hole 310 exposing the upper portion of the channel, a second contact hole 320 exposing the drain electrode, a third contact hole 330 exposing the gate pad pattern 302c, and a fourth contact hole 340 exposing the data pad pattern 306b.

Subsequently, as illustrated in FIG. 3E, the passivation layer 308 is etched using the photoresist pattern 309 as a mask. The gate insulating layer 303 under the third contact hole 330, that is, the gate insulating layer 303 on the gate pad pattern 308 is further etched. If the passivation layer 308 and the gate insulating layer 303 include silicon nitride, they may be etched by the same etching method.

As the gate insulating layer 303 under the third contact hole 330 is etched, only a small portion of the conductive layer 306 under the first, second and fourth contact holes 310, 320 and 340 is removed, because the conductive layer pattern such as molybdenum is not easily etched by the etchant used for passivation layer 308.

Figure 3F:
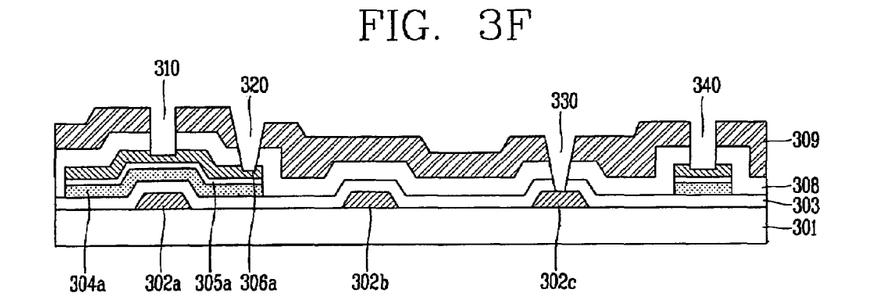

In a particular embodiment, in which molybdenum is used as the conductive layer 306, the molybdenum layer is etched by as much as about 1000 Å while the gate insulating layer 303 under the first contact hole 310 is dry-etched. As a result of the etching through the contact holes, the conductive layer 306a at the upper portion of the channel, the conductive layer 306a at an upper portion of the drain region, the data pad pattern 306b, and the gate pad pattern 302c are exposed, as illustrated in FIG. 3F.

Figure 3G:
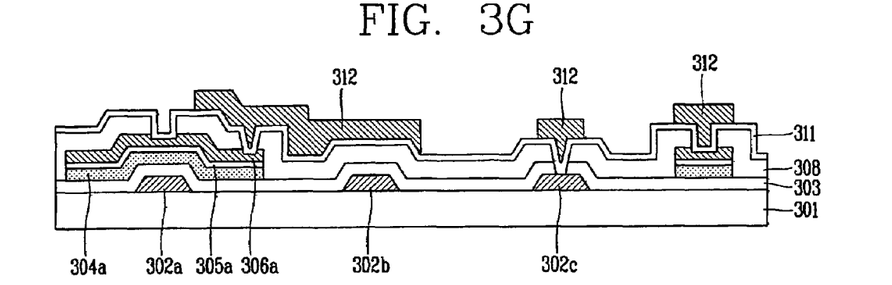

Subsequently, after removing the photoresist pattern 309, as illustrated in FIG. 3G, transparent electrode material is applied on the resulting structure. ITO (Indium Tin Oxide) or IZO (Indium Zinc Oxide) may be used in the transparent electrode material, and may be formed by a sputtering method, although other transparent electrode materials and deposition methods may be employed, provided that it resists dry etching in a manner similar to ITO.

Figure 3H:
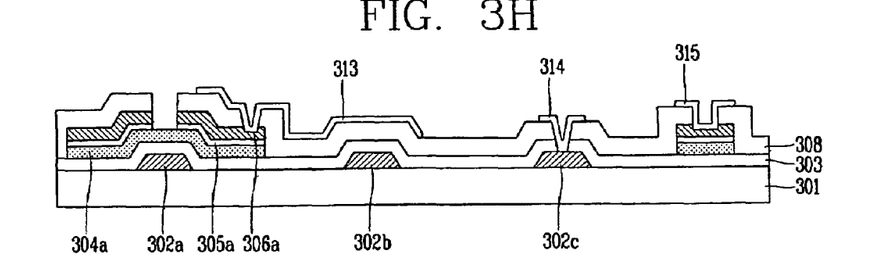

After applying the transparent electrode materials 311, a photoresist (not shown) is applied on the transparent electrode materials 311, and exposure and development processes are performed using a fourth mask to form a photoresist pattern 312, which defines a pixel electrode 313, a gate pad 314, and a data pad 315. Subsequently, the transparent electrode material is etched using the photoresist 312 as a mask. The dry etching method may be used for etching. As a result, as illustrated in FIG. 3H, a pixel electrode 313, a gate pad 314 and a data pad 315 are respectively defined.

Subsequently, the conductive layer 306a and the second semiconductor layer 305a under the first contact hole 310 are further dry-etched using the photoresist 312 as a mask. In addition, in the etching process using the photoresist pattern 312 as a mask, the transparent electrode materials 311 and conductive layer 306a at the first contact hole 310 may be wet-etched and the second semiconductor layer 305a at the first contact hole 310 may be dry-etched. As a result, the conductive layer 306a is separated into the source electrode 316 and the drain electrode 317 to form a thin film transistor.

Since a part of the conductive layer pattern 306a is etched in the process of etching the gate insulating layer under the first contact hole 310, the conductive layer pattern 306a at the first contact hole 310 may be removed easily by weak dry etching. Accordingly, the conductive layer 306a and the second semiconductor layer 305a at the first contact hole are removed to thereby form the source and drain electrodes without heavily damaging the passivation layer exposed by the photoresist pattern 312.

In the above-described method for fabricating a liquid crystal display device, the photoresist pattern 312 that has been used when forming the pixel electrode is continually used as a mask to remove the electrode layer 306a and the second semiconductor layer 305a at the upper portion of the channel. However, since material of the pixel electrode 313 is strong against the weak dry etching gas, the pixel electrode 313 may be used as an etching mask in addition to the photoresist pattern 312 during the etching of the conductive layer 306a and second conductive layer 305a in the first contact hole.

Accordingly, the method of the present invention uses a first mask when forming a gate electrode, a second mask when forming an active pattern, a third mask when forming a plurality of contact holes at an upper portion of a channel layer, and a fourth mask when forming a pixel electrode and source and drain electrodes, so that the resulting liquid crystal display device may be completed by four masks without using a diffraction exposure method. Since a liquid crystal display device is fabricated through a four-mask process in the present invention, the number of processes may be reduced to increase production efficiency in comparison to the related five-mask process.

In addition, compared to the related art four-mask process, the present invention uses four masks but at lower cost by not using an expensive diffraction mask. Instead, the present invention uses different etching rates between an insulating layer and an electrode layer, which is used for source and drain electrodes, in fabricating a thin film transistor.

It will be apparent to those skilled in the art that various modifications and variations can be made in the present invention without departing from the spirit or scope of the invention. Thus it is intended that the present invention cover the modifications and variations of this invention provided they come within the scope of the appended claims and their equivalents.

What is claimed is:

1. A method for fabricating a thin film transistor for a liquid crystal display device, comprising:
    forming a gate electrode;
    forming a first insulating layer on the gate electrode;
    forming a semiconductor layer on the first insulating layer having a first etching rate;
    forming a conductive layer on the semiconductor layer, the conductive layer having a second etching rate;
    forming a second insulating layer having a third etching rate;
    forming plurality of openings on the second insulating layer using a first photoresist pattern;
    forming a pixel electrode on the second insulating layer using a second photoresist pattern; and
    forming a source electrode and a drain electrode by removing the conductive layer and the semiconductor layer on a channel region using the second photoresist pattern as a mask, wherein the removing includes using at least one etchant selected based on the first, second, and third etching rates.

2. The method of claim 1, wherein the forming the pixel electrode comprises:
    forming a transparent electrode material on the second insulating layer having the plurality of openings;
    forming the second photoresist pattern;
    etching the transparent electrode materials using the second photoresist pattern as mask.

3. The method of claim 2, wherein the forming the source and drain electrodes includes:
    dry-etching the transparent electrode material; and
    weak dry-etching the conductive layer and the semiconducting layer.

4. The method of claim 1, wherein the forming the semiconductor layer includes:
    forming a first semiconductor layer having amorphous silicon on the first insulating layer; and
    forming a second semiconductor layer having high density impurities on the first semiconductor layer.

5. The method of claim 4, wherein the forming the source and drain electrodes includes:
    wet-etching the transparent electrode material and the conductive layer at the channel region; and
    dry-etching the second semiconductor layer at the channel.

6. The method of claim 1, wherein the forming the plurality of openings includes:
    forming a first opening exposing the conductive layer on the channel region; and
    forming a second opening exposing the conductive layer on a drain region.

7. The method of claim 1, wherein the conductive layer includes molybdenum.

8. The method of claim 1, wherein the removing the conductive layer and the second semiconductor layer at the channel region includes sequentially dry-etching.

9. A method for fabricating a liquid crystal display device, comprising:
    forming a gate electrode, a storage electrode and a gate pad pattern on a substrate;
    forming a first insulating layer covering the gate electrode, the storage electrode and the gate pad pattern on the substrate;
    forming a semiconductor layer on the first insulating layer;
    forming a conductive layer on the semiconductor layer;
    forming an active region and a data pad pattern by patterning the conductive layer and the semiconductor layer;
    forming a second insulating layer covering the active region and the data pad pattern;
    forming a plurality of openings on the second insulating layer using a first photoresist pattern as a mask, wherein the openings include a first opening exposing the conductive layer on a channel region, a second opening exposing the conductive layer on a drain region, a third opening exposing the gate pad pattern region and a fourth opening exposing the conductive layer on the data pad pattern;
    forming a transparent electrode material on the second insulating layer having the plurality of openings;
    forming a pixel electrode, gate pad and data pad by patterning the transparent electrode materials using a second photoresist pattern as a mask;
    removing the second photoresist pattern on the second insulating layer; and
    removing the conductive layer and the second insulating layer at the channel region using the pixel electrode as a mask, thereby forming a source and drain electrodes.

10. The method of claim 9, wherein the forming the pixel electrode includes:
    forming the transparent electrode material on the second insulating layer having the plurality of openings;
    forming a second photoresist pattern defining the pixel electrode on the second insulating layer;
    etching the transparent electrode material.

11. The method of claim 10, wherein a gate pad and a data pad are substantially simultaneously formed in the forming the pixel electrode.

12. The method of claim 9, wherein the forming the semiconductor layer includes:
    forming a first semiconductor layer including amorphous silicon on the first insulating layer; and
    forming a second semiconductor layer having high density impurities on the first semiconductor layer.

13. The method of claim 9, wherein the forming a plurality of openings on the second insulating layer further includes removing the first insulating layer in the gate pad pattern region using the first photoresist pattern as a mask, thereby exposing the gate pad pattern.

14. The method of claim 13, wherein the conductive layer at the first opening, the second opening and the fourth opening are partially removed in the removing the first insulating layer on the gate pad pattern.

15. The method of claim 9, wherein the conductive layer has a different dry-etching rate to the second insulating layer.

16. The method of claim 15, wherein the conductive layer includes molybdenum.

17. The method of claim 9, wherein the patterning the transparent electrode material and the removing the conductive layer and second semiconductor layer at the channel region include performing dry etching sequentially.

18. The method of claim 9, wherein the patterning the transparent electrode material includes wet-etching the transparent electrode material, and the removing the conductive layer and second semiconductor layer at the channel region includes dry-etching the conductive layer and second semiconductor layer.

19. The method of claim 9, wherein the patterning the transparent electrode includes dry-etching the transparent electrode material, and the removing the conductive layer and second semiconductor layer at the channel region includes weak dry-etching the conductive layer and second semiconductor layer.

20. A method for fabricating a thin film transistor for a liquid crystal display device, comprising:
   forming a gate electrode;
   forming a first insulating layer on the gate electrode;
   forming a semiconductor layer on the first insulating layer having a first etching rate;
   forming a conductive layer on the semiconductor layer, the conductive layer having a second etching rate;
   forming a second insulating layer having a third etching rate;
   forming plurality of openings on the second insulating layer using a first photoresist pattern;
   forming a pixel electrode on the second insulating layer using a second photoresist pattern; and
   forming a source electrode and a drain electrode by removing the conductive layer and the semiconductor layer on a channel region using the second photoresist pattern as a mask, wherein the removing includes using at least one etchant selected based on the first, second, and third etching rates, and wherein the first etching rate is higher than an etching rate of the first insulating layer, the second etching rate is lower than the etching rate of the first insulating layer, and the third etching rate is higher than the second etching rate.

* * * * *